United States Patent
Shenhar et al.

(10) Patent No.: US 12,024,604 B2
(45) Date of Patent: Jul. 2, 2024

(54) MULTI-MORPHOLOGY BLOCK CO-POLYMER FILMS AND PROCESSES FOR THEIR PREPARATION

(71) Applicant: Yissum Research Development Company of The Hebrew University of Jerusalem Ltd., Jerusalem (IL)

(72) Inventors: Roy Shenhar, Mevasseret Zion (IL); Elisheva Michman, Jerusalem (IL); Marcus Muller, Gottingen (DE)

(73) Assignee: Yissum Research Development Company of The Hebrew University of Jerusalem Ltd., Jerusalem (IL)

(*) Notice: Subject to any disclaimer, the term of this patent is extended or adjusted under 35 U.S.C. 154(b) by 712 days.

(21) Appl. No.: 17/262,770

(22) PCT Filed: Jul. 29, 2019

(86) PCT No.: PCT/IL2019/050856
§ 371 (c)(1),
(2) Date: Jan. 25, 2021

(87) PCT Pub. No.: WO2020/026236
PCT Pub. Date: Feb. 6, 2020

(65) Prior Publication Data
US 2022/0112342 A1    Apr. 14, 2022

Related U.S. Application Data

(60) Provisional application No. 62/711,537, filed on Jul. 29, 2018.

(51) Int. Cl.
C08J 5/18     (2006.01)
G03F 7/00    (2006.01)
G03F 7/16    (2006.01)

(52) U.S. Cl.
CPC .............. *C08J 5/18* (2013.01); *G03F 7/0002* (2013.01); *G03F 7/162* (2013.01); *G03F 7/168* (2013.01);
(Continued)

(58) Field of Classification Search
CPC ...... C08J 5/18; C08J 2353/00; C08J 2471/02; G03F 7/0002; G03F 7/162; G03F 7/168; C08K 2201/011
See application file for complete search history.

(56) References Cited

U.S. PATENT DOCUMENTS

2010/0075116 A1*  3/2010  Russell .............. B81C 1/00031
                                                    427/256
2012/0202017 A1   8/2012  Nealey et al.
(Continued)

FOREIGN PATENT DOCUMENTS

WO    WO 2015/023875 A1    2/2015
WO    WO 2015-023875 A1    2/2015

OTHER PUBLICATIONS

Bluhm, Stryrene/butadiene block copolymer micelles in heptane, Can. J. Chem. vol. 63, 1985, p. 249-252 (Year: 1985).*
(Continued)

*Primary Examiner* — K. Boyle
(74) *Attorney, Agent, or Firm* — Mark S. Cohen; Pearl Cohen; ZEDEK LATZER BARATZ LLP

(57) ABSTRACT

The invention relates to a block co-polymer film having different morphologies within said film, uses thereof and processes for its preparation.

14 Claims, 9 Drawing Sheets

(52) U.S. Cl.
CPC ........ *C08J 2353/00* (2013.01); *C08J 2471/02* (2013.01)

(56) References Cited

U.S. PATENT DOCUMENTS

| | | | | |
|---|---|---|---|---|
| 2013/0029113 A1* | 1/2013 | Nealey | ................ | C08F 8/08 525/122 |
| 2014/0284306 A1 | 9/2014 | Asakawa et al. | | |
| 2015/0072291 A1 | 3/2015 | Cho et al. | | |
| 2016/0251508 A1* | 9/2016 | Hustad | ................ | B82Y 40/00 524/504 |
| 2016/0297986 A1* | 10/2016 | Onses | ................ | G03F 7/0002 |
| 2017/0145250 A1 | 5/2017 | Navarro et al. | | |

OTHER PUBLICATIONS

Chang, J. B., et al. (2014). Design rules for self-assembled block copolymer patterns using tiled templates. Nature communications, 5(1), 1-9.

Chang, T. H., et al. (2017). The One-Pot Directed Assembly of Cylinder-Forming Block Copolymer on Adjacent Chemical Patterns for Bimodal Patterning. Macromolecular rapid communications, 38(18), 1700285.

Hannon, A. F., et al. (2013). Inverse design of topographical templates for directed self-assembly of block copolymers. ACS Macro Letters, 2(3), 251-255.

Hannon, A. F., et al. (2014). Optimizing topographical templates for directed self-assembly of block copolymers via inverse design simulations. Nano letters, 14(1), 318-325.

International Search Report issued for PCT Application No. PCT/IL2019/050856 dated Nov. 18, 2019.

Liu, G., et al. (2010). Integration of Density Multiplication in the Formation of Device-Oriented Structures by Directed Assembly of Block Copolymer-Homopolymer Blends. Advanced Functional Materials, 20(8), 1251-1257.

Park, S., et al. (2012). Guiding block copolymers into sequenced patterns via inverted terrace formation. Macromolecules, 45(5), 2494-2501.

Park, S., et al. (2016). Hierarchical manipulation of block copolymer patterns on 3D topographic substrates: beyond graphoepitaxy. Advanced Materials, 28(32), 6900-6905.

Son, J. G., et al. (2011). Assembly of sub-10-nm block copolymer patterns with mixed morphology and period using electron irradiation and solvent annealing. Nano letters, 11(11), 5079-5084.

Stein, A., et al. (2016). Selective directed self-assembly of coexisting morphologies using block copolymer blends. Nature communications, 7(1), 1-7.

Stoykovich, M. P., et al. (2007). Directed self-assembly of block copolymers for nanolithography: fabrication of isolated features and essential integrated circuit geometries. Acs Nano, 1(3), 168-175.

Xuan, Y., et al. (2004). Morphology development of ultrathin symmetric diblock copolymer film via solvent vapor treatment. Macromolecules, 37(19), 7301-7307.

* cited by examiner

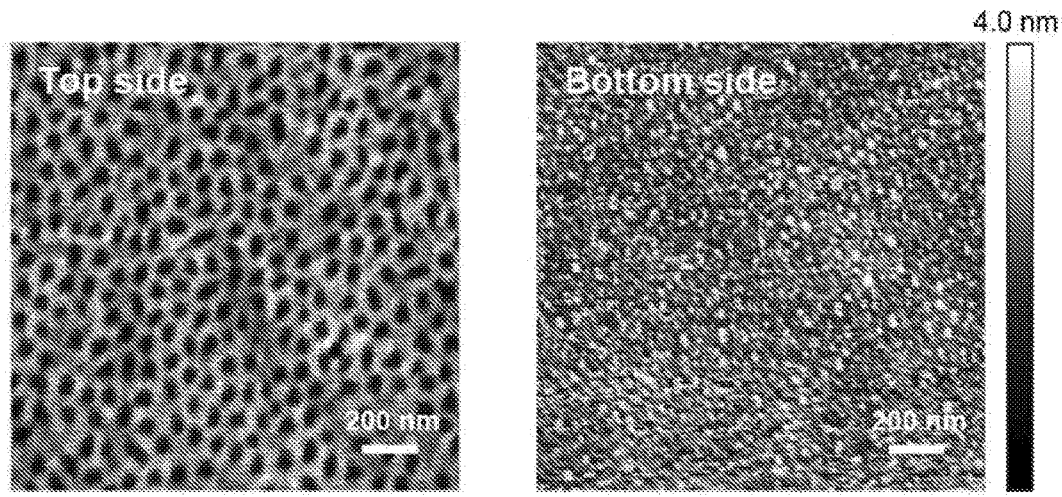
Figure 2d
Figure 2e
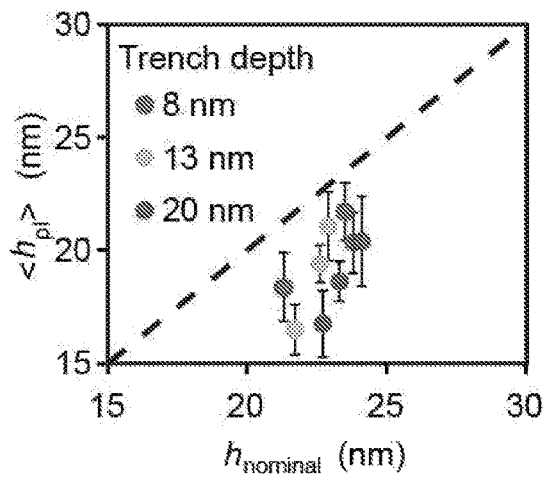
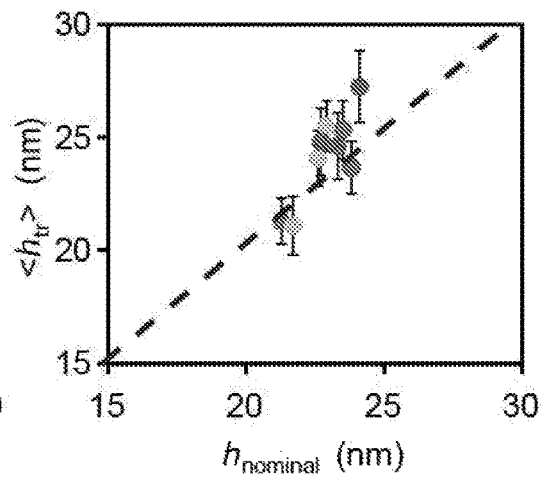
Figure 3a
Figure 3b
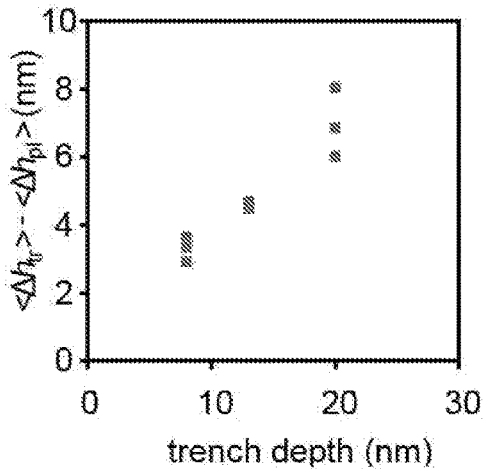
Figure 3c

MULTI-MORPHOLOGY BLOCK CO-POLYMER FILMS AND PROCESSES FOR THEIR PREPARATION

CROSS-REFERENCE TO RELATED APPLICATIONS

This application is a National Phase Application of PCT International Application No. PCT/IL2019/050856, International Filing Date Jul. 29, 2019, claiming the benefit of U.S. Patent Application No. 62/711,537, filed Jul. 29, 2018 which is hereby incorporated by reference.

BACKGROUND OF THE INVENTION

Block copolymers display a variety of surface patterns in thin films owing to microphase separation. Patterns such as parallel stripes and hexagonally-packed dots with periodicities of a few to a few hundred nanometers are readily obtained from many block copolymer compositions after thermal or solvent annealing under suitable conditions. Further chemical modification of the block copolymer domains and their selective decoration by functional materials such as metal and semiconductor nanoparticles, biopolymers, and polyelectrolytes gives rise to nano-patterned functional coatings, which find application in controlled drug release, sensing, photovoltaics, and catalysis.

Orienting block copolymer domains along macroscopic coordinates—a process termed "directed self-assembly" (DSA)—requires the employment of a patterned substrate, where the periodicity of the pattern is commensurate with the periodicity of the block copolymer. Both chemically- and topographically-patterned substrates can be created by lithographic approaches such as electron-beam lithography and nanoimprint lithography. Such structures have been successfully applied to the DSA procedure, giving rise to highly oriented, nearly defect free, patterned films. Block copolymer films oriented by DSA possess a huge potential for the microelectronics industry. For example, such films are now being used in the industry to fabricate nanoimprint lithography masters for mass production of storage media.

So far, works employing topographically patterned substrates have studied the assembly of block copolymer films with thicknesses that are larger than the radius of gyration of the polymer chain. The invention disclosed herein shows that assembling ultra-confined block copolymer films (i.e., where the film thickness is much smaller than the radius of gyration of the polymer) on topographically patterned substrates enables the creation of different morphologies on the plateaus and in the trenches of the substrate. These coexisting structures are explained as resulting from the modulation of the shape of the free surface of the film, caused by the topographical features of the underlying substrate, as well as difference between the film thickness on the plateaus and in the trenches, which arises from the fact that more material is deposited in the trenches than on the plateaus owing to capillary forces operating during spin coating.

Among the different available hybrid morphologies, particularly interesting is the morphology that displays parallel-lying lamellae in the trenches and hexagonally-ordered standing cylinders on the plateaus. As the film in the trenches features no surface pattern, such structures enable the exclusive decoration of the copolymer domains on the plateaus. Controlling the width of the gap between the topographic features by the lithography used to create the pattern substrate enables easy separation between decorated features on any scale (from a few nanometers to hundreds of micrometers and beyond). Such a separation is impossible to obtain without inducing a coexisting morphology. This option is particularly useful for photonic applications, where cross-talk between features is normally detrimental for the device functioning.

SUMMARY OF THE INVENTION

The present invention provides a film comprising at least one block co-polymer (BCP) having at least two block units; wherein said at least one BCP has different morphologies within said film; and wherein the thickness of said film is at most equal to the radius of gyration ($R_g$) of said at least one BCP.

In the context of the present invention the term "block co-polymer" (BCP) encompass a polymer comprising at least two (two or more) homopolymer subunits linked by a bond, said two different homopolymer are also referred to as block units. As such, a BCP may be a di-block copolymer (having two different block units), a tri-block copolymer (having three different block units) and also a multi-block copolymer (having multiple different block units). The difference between the block units may be envisaged by any parameter, including but not limited to different chemical properties, different electrostatic properties, different hydrophobic properties, different magnetic properties, different physical properties (length of chains, molar mass, etc.) and any combinations thereof.

Thus, in some embodiments, the at least one BCP within the film of the present invention has two block units. In another embodiment, the BCP has at least three block units. In another embodiment, the BCP has three block units. In another embodiment, the BCP has at least four block units. In another embodiment, the BCP has four block units.

In further embodiments, block units are selected from the group consisting of: polystyrene (PS), polymethylmetacrylate (PMMA), poly(2-vinyl pyridine), poly(4-vinyl pyridine), poly(ethylene oxide), poly(n-butyl acrylate), polyacrylates, polymethacrylates, polyisoprene, poly(1,4-butadiene), poly(1,2-butadiene), poly(lactic acid), poly(epsilon-caprolactone) and any combinations thereof. Each possibility represents a separate embodiment of the present invention.

Due to incompatibility between the blocks, block copolymers undergo micro/nano scale-phase separation, allowing the blocks form nanometer-sized periodical structures (morphologies), depending on the relative lengths of each block.

Such phase separation allows the BCP to form a periodic nanostructure. Depending on the relative lengths of each block, several morphologies can be obtained. A person skilled in the art of the invention would appreciate that such nano/microscopic phase separation is usually observable and analyzed via electron microscopes such as SEM/TEM (scanning electron microscope and transmission electron microscope, respectively), SFM (scanning force microscopy).

BCP can further be characterized by its radius of gyration ($R_g$), defined as the average squared distance of any segment (or repeat unit) of the polymer from the polymer's center of mass. Accordingly, a person skilled in the art of the invention would recognize that $R_g$ is directly correlated to the extent of coiling or twisting within a polymer chain. Unless otherwise stated herein, "$R_g$" in this regard always direct to the $R_g$ of a (co)polymer in its bulk state (i.e. not to nanoparticulate polymer). $R_g$ can be determined experimentally with static light scattering as well as with small-angle neutron- and X-ray scattering.

Another property that can define the BCP is the lamellar periodicity denoted herein $L_0$. This property, $L_0$, normally amounts to the effective length of two BCP chains.

When referring to "different morphologies of said at least one BCP" it should be understood to relate to the fact that the film of the invention is obtained having at least two defined morphologies of said at least one BCP. Non-limiting examples of such morphologies include lamellae and hexagonal lattice, lamellae and body centered cubic lattice, hexagonal and body centered cubic lattices and the like.

When referring to "the thickness of said film is at most equal to the radius of gyration ($R_g$) of said at least one BCP" it should be understood to relate to a thickness of the film of the present invention, where such thickness does not exceed $R_g$, as defined hereinabove. In another embodiment, the film thickness is smaller than $R_g$. In another embodiment, the film thickness is equal to 10-20, 20-30, 30-40, 40-50, 50-60, 60-70, 70-80, 80-90 or 90-99% of $R_g$. Each possibility represents a separate embodiment of the present invention.

In another aspect, the invention provides a film comprising at least one block co-polymer (BCP) having at least two block units; wherein said film has at least two morphological sections of said at least one BCP; and wherein the thickness of said film is at most (does not exceed) equal to the radius of gyration ($R_g$) of said at least one BCP.

The term "at least two morphological sections of said at least one BCP" should be understood to relate to physical sections of the film where each portion has a different morphology (as described hereinabove). A person skilled in the art of the invention would appreciate that such physical portions or sections are not to be confused with the units of the BCP; physical portion or section relates to a portion of the film which can be observed physically by various methods and is characterized by specific morphology which stems from packing and interactions of/between the BCP blocks. In another embodiment, a film of the present invention comprises one BCP of polystyrene (PS) and poly(methyl metacrylate) (PMMA) block units and this film has morphological sections of lamellae/hexagonal lattice.

In another aspect, the invention provides a film comprising at least one block co-polymer (BCP) having at least two block units; wherein said film has at least two morphological sections of said at least one BCP; and wherein the thickness of said film is at most equal to $½L_0$ of said at least one BCP.

When referring to "the thickness of said film is at most equal to $½L_0$ of said at least one BCP" it should be understood to relate the thickness of the film of the present invention, which does not exceed $½L_0$, as defined hereinabove. In another embodiment, the film thickness is smaller than $½L_0$. In another embodiment, the film thickness is equal to 0.1-0.2, 0.2-0.3, 0.3-0.4 or 0.4-0.5 of $L_0$. Each possibility represents a separate embodiment of the present invention.

In some embodiments, different morphological sections of the BCP within the film of the present invention also have different thicknesses for each section.

It was found by the inventors of the present invention, that when: (i) all film has a thickness which does not exceed $½L_0$ or $R_g$; and (ii) each segment has different thickness (which does not exceed $½L_0$ or $R_g$); and (iii) the substrate is selective to one block; such conditions give rise to segments with different morphology and/or different within the same film.

In some embodiments, the film of the present invention comprises at least one BCP. In another embodiment, the film comprises at least two BCP. In another embodiment, the film comprises at least three BCP.

In some embodiments, the thickness of the film of the present invention or segments thereof is between 2-50 nm.

In some embodiment, the film of the present invention further comprises at least one filler. In another embodiment, the at least one filler is an atomic, molecular or polymeric filler. In another embodiment, the filler is a nano-dimensional material. In another embodiment, the nano-dimensional material is selected from nanoparticle, nanotube, nanosheet, nanoribbon and any combinations thereof. Each possibility represents a separate embodiment of the present invention. In another embodiment, the nano-dimensional material is selected from metal, metal oxide, metalloid, alloy, quantum dot, polymer, carbon material and any combination thereof. In another embodiment, non-limiting examples of nano dimensional metal can be selected from the group consisting of Ag, Cu, Pd, Pt, Au and alloys thereof. Each possibility represents a separate embodiment of the present invention. In another embodiment, non-limiting examples of nano dimensional metal oxide material are selected from the group consisting of $TiO_2$, $ZrO_2$, $ZnO_2$, $Al_2O_3$, FeO, $Fe_2O_3$, $Fe_3O_4$ and any combination thereof. Each possibility represents a separate embodiment of the present invention. In another embodiment, non-limiting examples of nano dimensional metalloid material are selected from the group consisting of Si, Ge, Sb, Te and any combination thereof. Each possibility represents a separate embodiment of the present invention. In another embodiment, non-limiting examples of nano dimensional quantum dot material are selected from the group consisting of CdSe, CdS, ZnS, InP, ZnSe CuS and any combination thereof. Each possibility represents a separate embodiment of the present invention. Each possibility represents a separate embodiment of the present invention. In another embodiment, non-limiting examples of nano dimensional carbon material are selected from the group consisting of carbon nanotube, graphene, graphene oxide, fullerenes, $WS_2$ nanotubes, Si nanowires and any combination thereof. Each possibility represents a separate embodiment of the present invention.

Within the context of the present invention, the term "filler" should be understood to relate to an additive included in the film of the present invention which is not part of the polymeric chain in the at least one BCP.

In another aspect, the invention provides a device comprising at least one film as described hereinabove. In some other embodiments, the device is selected from the group consisting of a photonic device, a sensor, a microelectronic device and a semiconductor device. Each possibility represents a separate embodiment of the present invention.

In yet another aspect, the invention provides a process for the preparation of a film as defined hereinabove; said process comprising the steps of: (a) providing a topographically patterned substrate; (b) providing a solution comprising at least one block co-polymer (BCP); and optionally at least one filler; (c) coating top of the topographically patterned substrate with the provided solution, to form a coated film; and (d) annealing the coated film, thereby forming the film of the present invention.

It is important to note that films of the present invention show extreme morphological sensitivity to film thickness. Using the topography as a thickness-differentiating mechanism (i.e., that causes more material to deposit in the trenches and less material to be deposited on the plateaus of the substrate)—together with the extreme sensitivity to film thickness and the substrate selectivity—allow for obtaining mixed morphology in a controlled fashion.

In some embodiment, the topographically patterned substrate of the process of the present invention is patterned using electron-beam lithography, plasma treatment, reactive ion etching, any other method as known in the art of the invention or any combination thereof. Each possibility represents a separate embodiment of the present invention.

In some embodiments said substrate is selected from silicon wafer, silicon wafer with native oxide, silicon wafer with thermally grown oxide, silicon nitride wafers, glasses, gallium nitride and any combinations thereof.

In some embodiments, the topographically patterned substrate of the process of the present invention has a pattern of trenches and plateaus. Each possibility represents a separate embodiment of the present invention. In another embodiment, the topographically patterned substrate of the process of the present invention has a pattern of trenches and plateaus and trenches depth is between 2-100 nm. In another embodiment, the trenches width is between 2-5000 nm. In another embodiment, the plateaus width is between 2-1000 nm.

In some embodiments, the coating method of the coating step of the process of the present invention is selected from spin coating, dip coating, spray coating, and roll casting. In another embodiment, the coating method is dip coating. In another embodiment, the spin coating is conducted at a rate of between 1000-8000 rpm. In another embodiment, the rate is between 1000-2000 rpm. In another embodiment, the rate is between 2000-3000 rpm. In another embodiment, the rate is between 3000-4000 rpm. In another embodiment, the rate is between 4000-5000 rpm. In another embodiment, the rate is between 5000-6000 rpm. In another embodiment, the rate is between 6000-7000 rpm. In another embodiment, the rate is between 7000-8000 rpm.

In some embodiments, the concentration of the BCP within the provided solution of the process of the present invention is at least 0.01 wt %. In another embodiment, the concentration is between 0.01-0.05 wt %. In another embodiment, the concentration is between 0.05-0.1 wt %. In another embodiment, the concentration is between 0.1-0.5 wt %. In another embodiment, the concentration is between 0.5-1.0 wt %.

In some embodiments, the annealing of the film of the process of the present invention is solvent vapor annealing or thermal annealing. In another embodiment, the annealing is solvent vapor annealing performed for a duration of between 1-20 minutes. In another embodiment, solvent vapor annealing is performed for a duration of between 1-5 minutes. In another embodiment, solvent vapor annealing is performed for a duration of between 5-10 minutes. In another embodiment, solvent vapor annealing is performed for a duration of between 10-15 minutes. In another embodiment, solvent vapor annealing is performed for a duration of between 15-20 minutes. In another embodiment, solvent vapor annealing is performed for a duration of 3 minutes. In another embodiment, the annealing is thermal annealing performed for a duration of between 5-60 minutes. In another embodiment, thermal annealing is performed for a duration of between 5-10 minutes. In another embodiment, thermal annealing is performed for a duration of between 10-20 minutes. In another embodiment, thermal annealing is performed for a duration of between 20-30 minutes. In another embodiment, thermal annealing is performed for a duration of between 30-40 minutes. In another embodiment, thermal annealing is performed for a duration of between 40-50 minutes. In another embodiment, thermal annealing is performed for a duration of between 50-60 minutes. In another embodiment, thermal annealing is performed for a duration of 30 minutes.

In some embodiments, the provided BCP solution of the process of the present invention further comprises at least one solvent. In another embodiment, non-limiting examples of the solvent are selected from the group consisting of: chloroform, dichloromethane, teterahydrofuran, N,N-dimethyl formamide, diethyl ether, ethyl methyl ether, ethanol, methanol, hexane, heptane, octane, nonane, decane, ethylene glycol, N-methyl-2-pyrrolidone, acetone, acetic acid, toluene, benzene, 1,2-dichlorobenzene and any combination thereof. Each possibility represents a separate embodiment of the present invention.

In some embodiments, the provided BCP solution of the process of the present invention further comprises at least one filler as described hereinabove.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 2a-2e show (2a) Simulation results of the assembly of lamellar block copolymer films of different thicknesses, h, in the ultra-confined regime on selective substrates. PS and PMMA domains are depicted in red and blue, respectively; $R_e$ and $\Lambda N$ denote the average end-to-end distance of the copolymer chain and the preference of the substrate for PMMA domains, respectively. (2b, 2c) Side and bottom views of the $h=0.5R_e$ and $\Lambda N=11$ system, showing the neck-like cross-section of the PMMA domains (2b) and the preferential substrate wetting by PMMA (2c). (2d, 2e) SFM images of the top (2d) and bottom (2e) sides of a film cast on a smooth substrate.

FIGS. 3a-3c show (3a, 3b) Graphs showing the average film thickness above the plateaus (a) and trenches compared to the nominal film thickness measured in un-patterned areas on the same sample (dashed line). (3c) Dependence of the film thickness difference between the trench and plateau on the trench depth.

Figure 1A:
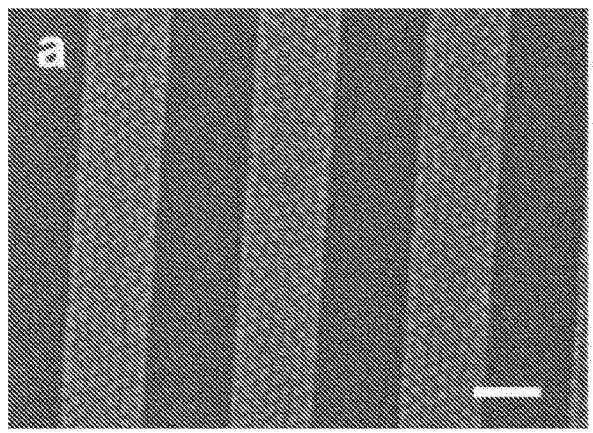
FIGS. 1a-1g shows PS-b-PMMA films showing dot-patterned regions spaced arbitrarily by pattern-less domains assembled on topographically modified substrates. (1a-1d) SEM images of 23 nm-thick films assembled on substrates featuring 13 nm-deep (1a) and 20 nm-deep (1b-1d) trenches. Trench/plateau lateral widths: (a) 640/640 nm; (b) 360/320 nm; (1c) 160/160 nm; (1d) 2,000/320 nm. Inset in (1b) shows a schematic illustration of the three-dimensional morphology; inset in (1c) shows the edge of the lithographically patterned area. SFM height image (1e) and height profile (1f, 1g) of an area that was partially exposed by scratching (nominal film thickness is 23 nm; 20 nm trench depth; trench/plateau widths 640/320 nm). The height profile is overlaid on a schematic illustrating the substrate topography. (1g) The same profile as in (1f) with 2:1 height:width ratio. All scale bars represent 500 nm.
Figure 1B:
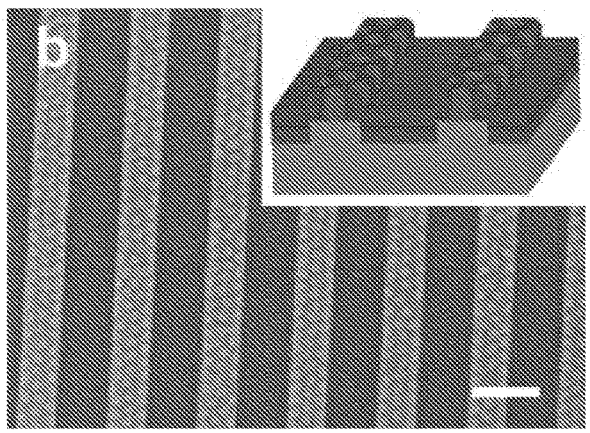
Figure 1C:
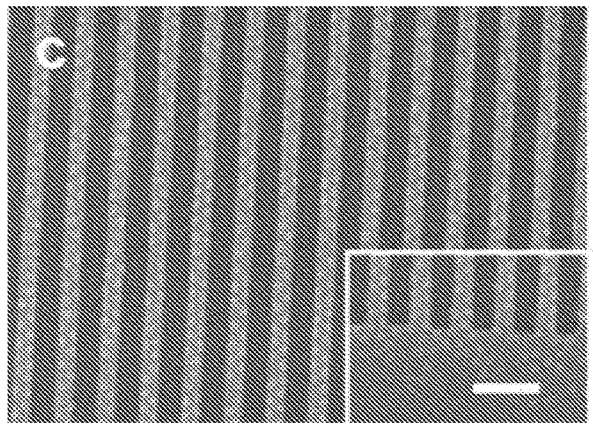
Figure 1D:
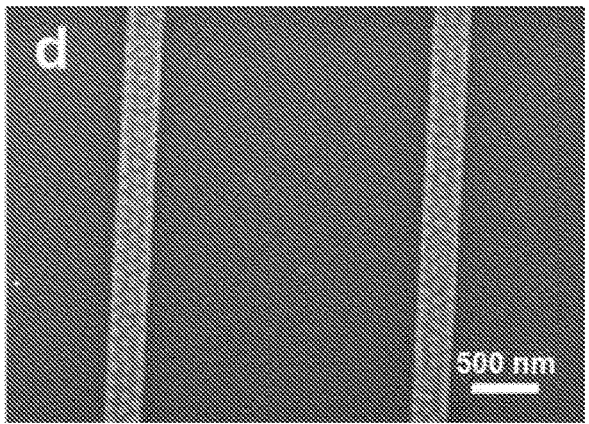

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Various types of devices require hierarchically nanopatterned substrates, where spacing between patterned domains is controlled. Ultra-confined films exhibit extreme morphological sensitivity to slight variations in film thickness when the substrate is highly selective toward one of the blocks. Here, it is shown that using the substrate's topography as a thickness differentiating tool enables the creation of domains with different surface patterns in a fully controlled fashion from a single, unblended block copolymer. This approach is applicable to block copolymers of different compositions and to different topographical patterns, and thus opens numerous possibilities for hierarchical construction of multifunctional devices.

The ability to create regions of a desired pattern on a surface and arbitrarily space between them with non-patterned regions is prerequisite in various applications, including meta-surfaces, bit-patterned media, hybrid integrated circuits that involve plasmonic components, regulating cell functions, and sensing. For example, controlling the distances between elements of a meta-surface enable tuning its optical response, and spacing between plasmon waveguides is necessary for avoiding cross-talk between adjacent channels through which signals are routed.

Considerable recent progress in the directed self-assembly of block copolymers (BCPs) now enables not only the fabrication of thin films with highly aligned domains but also obtaining complex morphologies such as various meshes, layered structures, non-regular patterns, and mixed morphologies. These dense structures are obtained through the application of elegantly designed processes that combine nano-fabrication and self-assembly steps. The most important directed self-assembly approaches rely on either chemo-epitaxy, i.e., orientation and registration of copolymer domains that are directed by a chemically patterned, two-dimensional substrate, or grapho-epitaxial alignment using a topographically patterned substrate. Graphoepitaxy has the advantage of being three-dimensional in nature, which could be used to induce truly three-dimensionally structured BCP films (e.g., meshes).

Despite the considerable progress in directed self-assembly, obtaining patterned regions with defined shapes that are separated by non-patterned domains remains a challenge. One option is to utilize chemical patterning to locally control domain orientation, but it requires multiple fabrication steps and fine tuning of BCP-homopolymer blend compositions. Subtractive approaches like imprinting into BCP films, local etching, and relying on de-wetting leave exposed substrates, undesired residual material, and more complex interfaces, which may not be compatible with further fabrication steps. Here it is shown that topographical features could be used to modulate local film thicknesses, which, under specific circumstances, leads to the formation of dual morphologies in a controlled fashion. Taking advantage of the fact that lying lamellae show no surface pattern enables arbitrary separation between patterned domains.

Samples featuring 100 micrometer-long stripes etched into silicon substrates (i.e., trenches) were prepared using standard electron-beam lithography followed by reactive ion etching. Each sample included the same array of patterns differing in widths of the trenches (in the range of 160-2,000 nm) and plateaus (in the range of 160-640 nm). Sets of samples featuring trench depths of 8, 13, and 20 nm were spin-coated with BCP solutions, yielding films with thicknesses in the range of 21-24 nm, which are all higher than the trench depth. All films were annealed under chloroform vapor for 15 minutes. Chloroform was selected for solvent annealing because it is rather non-selective toward PS and PMMA ($\chi_{CHCl_3,PS}$ and $\chi_{CHCl_3,PMMA}$ values calculated using Hansen solubility parameters equal 0.47 and 0.50, respectively).

FIG. 1 shows scanning electron microscopy (SEM) and scanning force microscopy (SFM) images of 23 nm-thick polystyrene-block-poly(methyl methacrylate) (PS-b-PMMA) films ($f_{PS}=0.48$) cast on topographically defined substrates. The block copolymer organizes in the bulk into alternating lamellae with 84 nm periodicity. Interestingly, the film displays two types of morphologies. The featureless appearance of the film in the trenches suggests the formation of lamellae oriented parallel to the trench floor. However, the film on the plateaus displays a dot pattern despite the near symmetric composition of the copolymer. This dual pattern is insensitive to the lateral width of the trenches (which spans 160-2,000 nm; see FIG. 6), pointing to the ability to obtain dot-patterned regions that are arbitrarily separated by featureless domains. The formation of a dot pattern from a lamellar BCP is attributed to the combination of strong thickness confinement and high substrate selectivity. Simulations of a soft, highly coarse-grained model of symmetric BCP on flat substrates are presented in FIGS. 2a, 2b, for various film thicknesses, h, and substrate selectivity values, ΛN. The systems were quenched from a disordered melt to incompatibility χN=30.

Figures 7A, 7B, 7C:
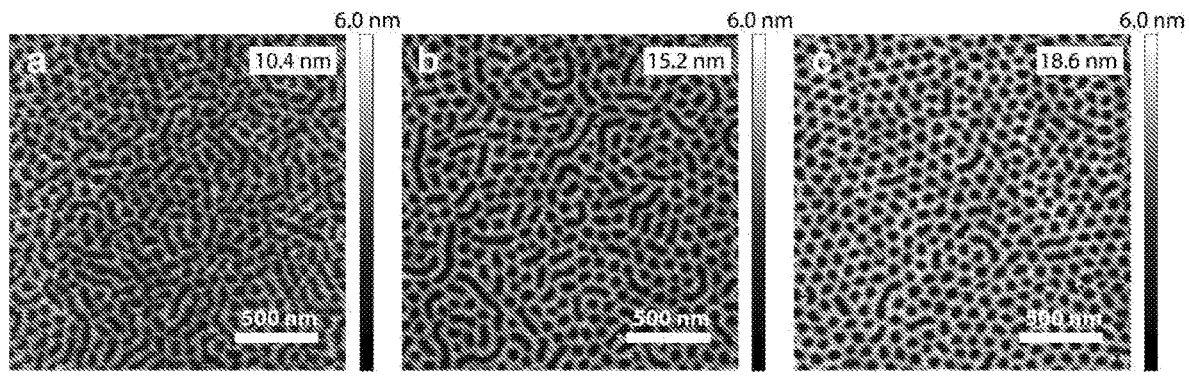
FIGS. 7a-7f show SFM images of thin PS-b-PMMA films cast at different thicknesses (top right corner) on flat $SiO_x$ substrates.
Figures 7D, 7E, 7F:
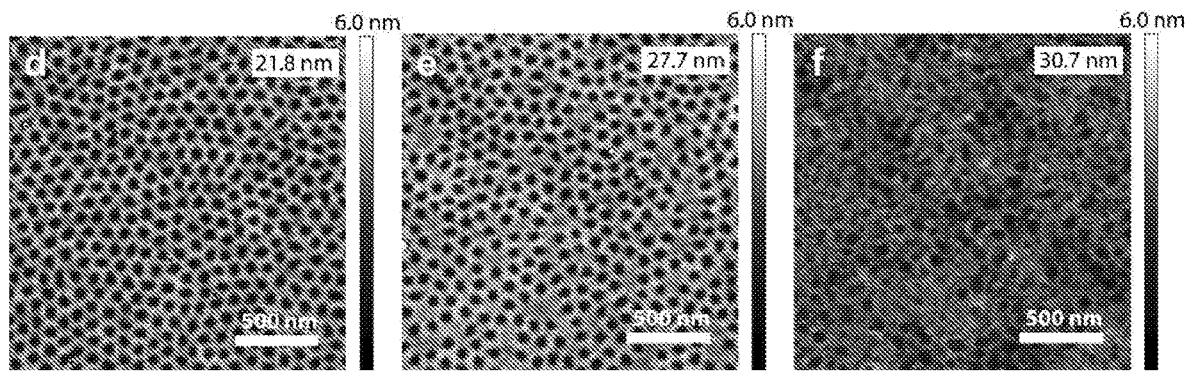

As expected, the top panels show that selective substrates give rise to lying lamellae, where the copolymer chains are oriented normal to the substrate on average. Upon decreasing the film thickness, it was observed that a transition from lying lamellae oriented parallel to the substrate to standing, perpendicularly-oriented lamellae (FIG. 2a, bottom row), where the copolymer chains lie flat on the substrate. The reason for this transition is that it reduces the amount of the PS/PMMA interfaces per chain. SFM images of BCP films cast at different thicknesses on flat substrates corroborate these results (FIG. 7).

Figure 2A:
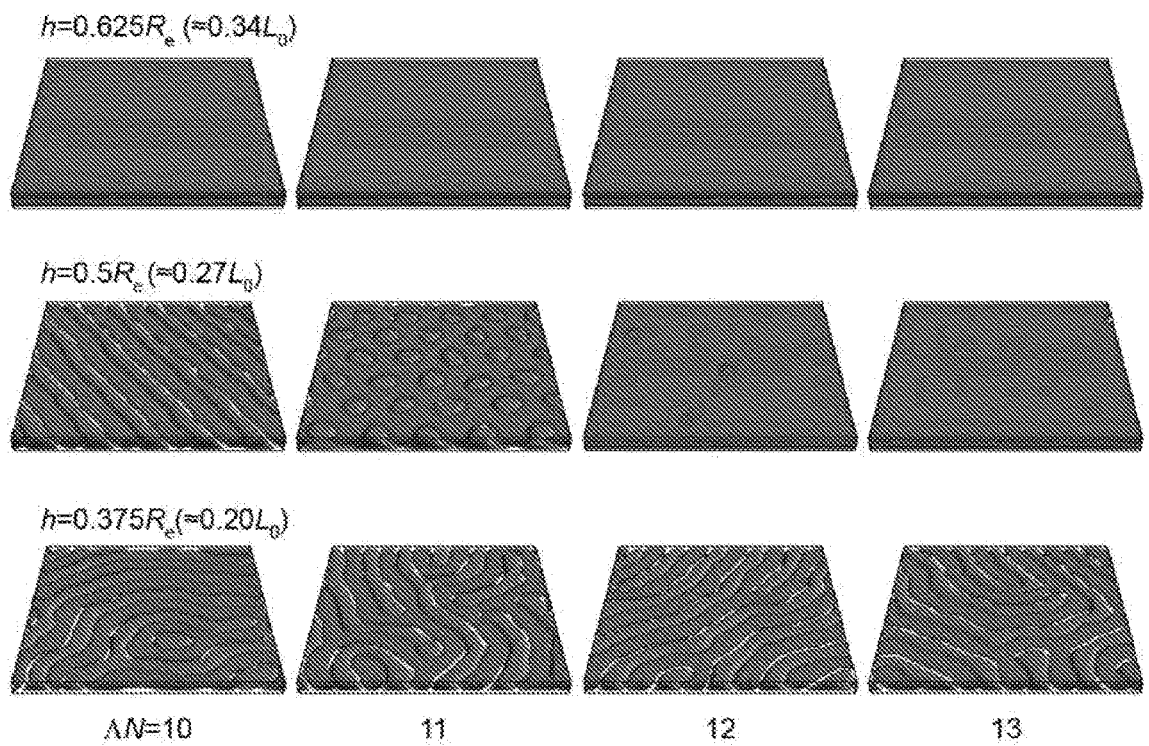
Figures 2B, 2C:
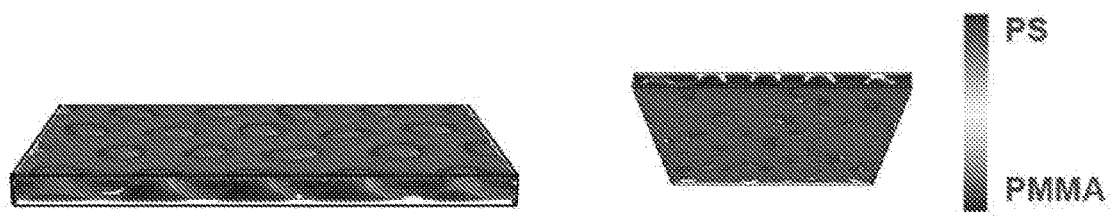
Figure 4A:
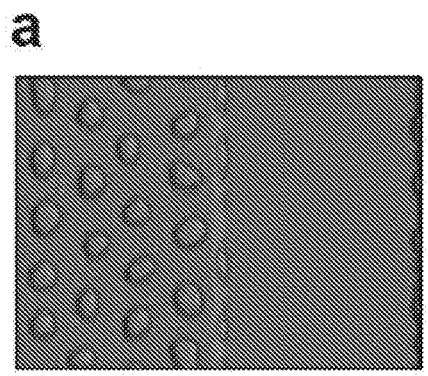
FIGS. 4a-4d show (4a) Top view and (4b) isometric view of simulation results showing the dual morphology obtained on substrates that consist of adjacent plateau and trench. The horizontal substrate interfaces exert $\Lambda N=11$; the sidewall of the trench exerts a slightly large selectivity, $\Lambda N=20$. The polymer film thicknesses are $h=0.5R_e$ and $h=0.625R_e$ on the plateau and in the trench, respectively. (4c, 4d) High resolution SEM and SFM images showing the topography of the film at the edge of the plateau. The SEM image was taken at a 40° tilt.
Figure 4B:
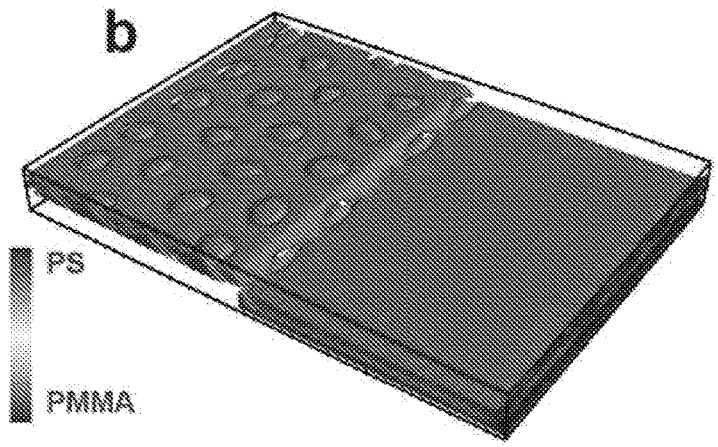
Figure 4C:
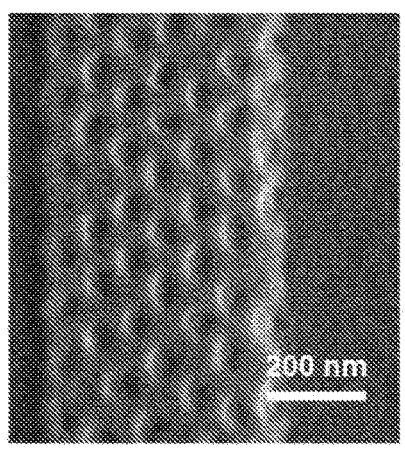
Figure 4D:
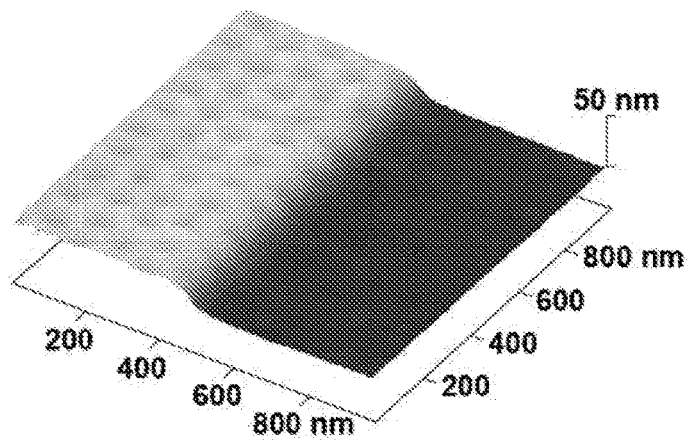
Figure 5A:
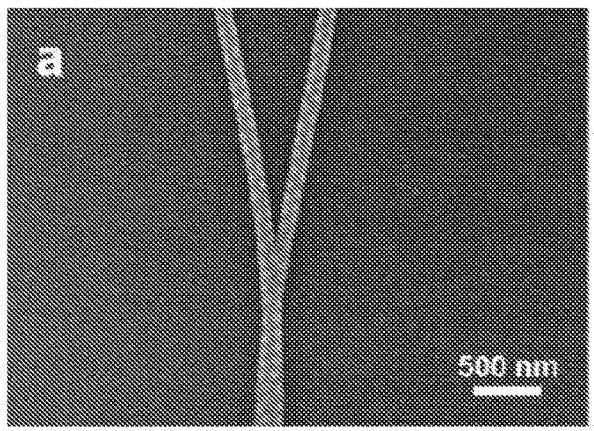
FIGS. 5a-5f show SEM images of: (5a) 23 nm-thick film assembled on substrates featuring 20 nm-deep trenches and irregular features. (5b) 30 nm-thick film with 42 nm-deep trenches in the shape of jogs. (5c-5f) 29-nm thick nanocomposite films of the same PS-b-PMMA block copolymer co-assembled with 13 nm Au-PEO nanoparticles on patterned substrates featuring 27 nm deep trenches. Nanoparticle filling fraction in all films was 1 vol %. Trench/plateau lateral widths: 160/160 nm; (5d) 480/320 nm; (5e) 240/160 nm; (5f) 640/320 nm. The inset illustration shows the 3D morphology schematically.
Figure 5B:
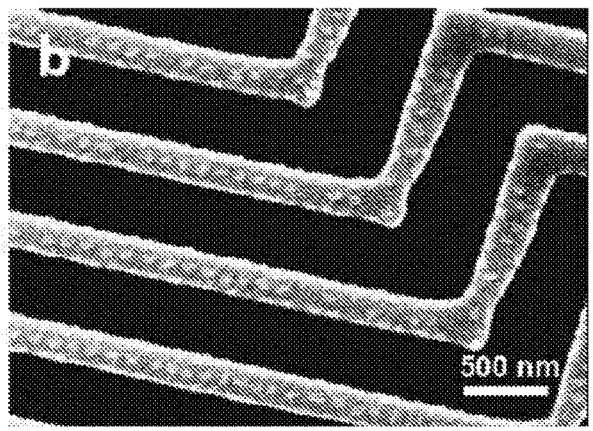
Figure 5C:
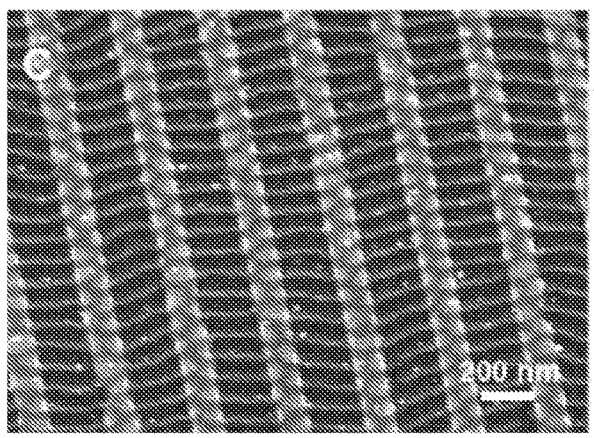
Figure 5D:
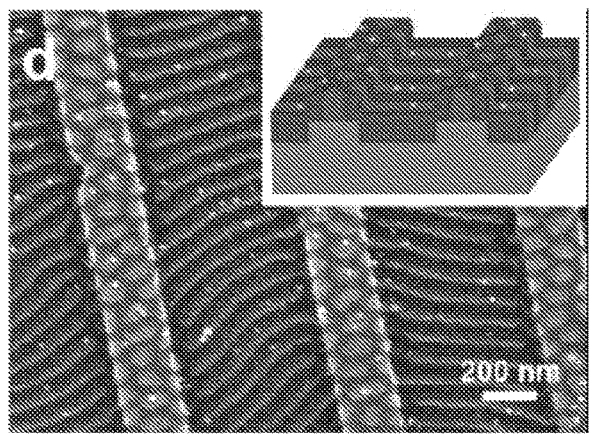
Figure 5E:
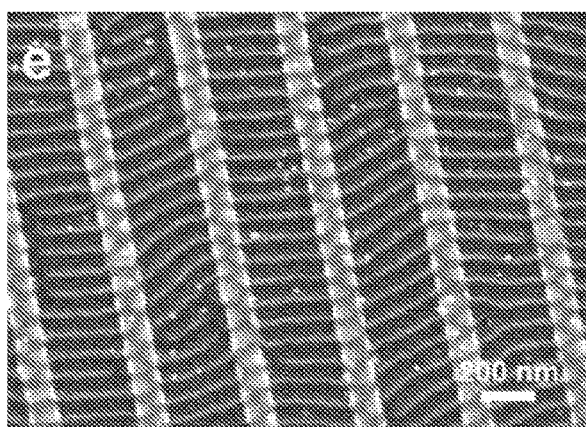
Figure 5F:
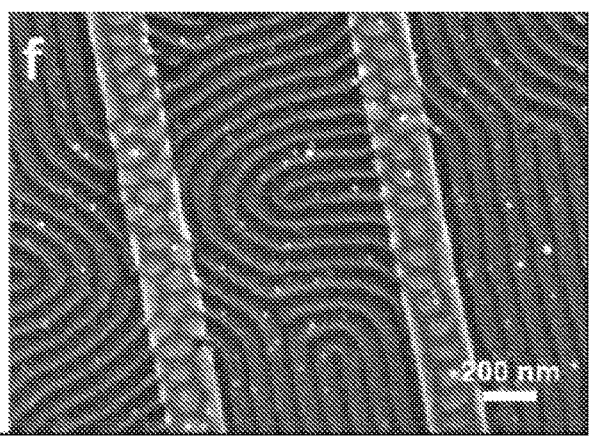
Figure 6A:
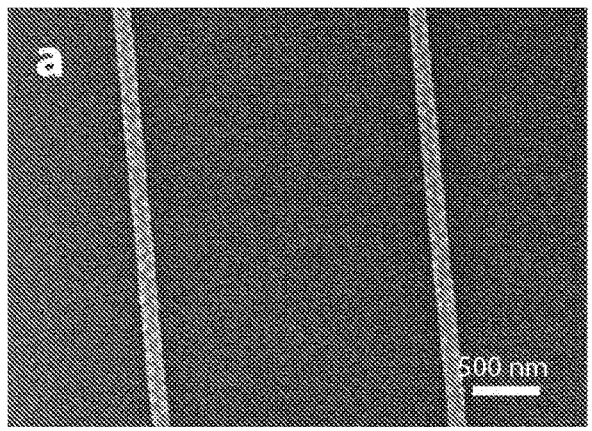
FIGS. 6a-6d show SEM images of PS-b-PMMA films assembled on topographically modified substrates showing dot-patterned regions separated arbitrarily by pattern-less domains of arbitrary width (6a-6c) and over large areas (6d). (6a,6b) 23 nm-thick film assembled on substrates featuring 20 nm-deep trenches, (6c) 23 nm-thick film with 13 nm-deep trenches, and (6d) 25 nm-thick film with 38 nm-deep trenches. Trench/plateau lateral widths: 6(a) 2,000/160 nm; (6b) 2,000/640 nm; (6c) 640/320 nm; (6d) 1,500/160 nm.
Figure 6B:
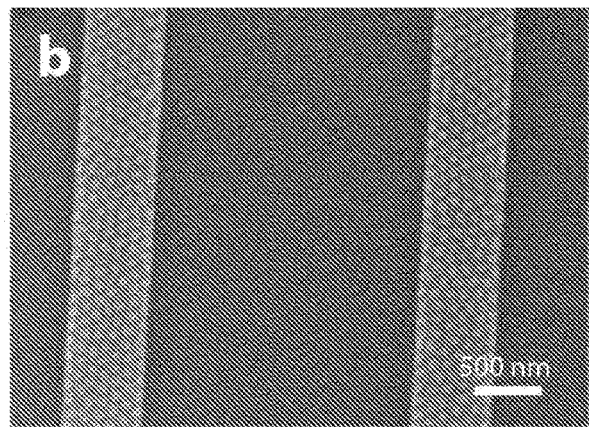
Figure 6C:
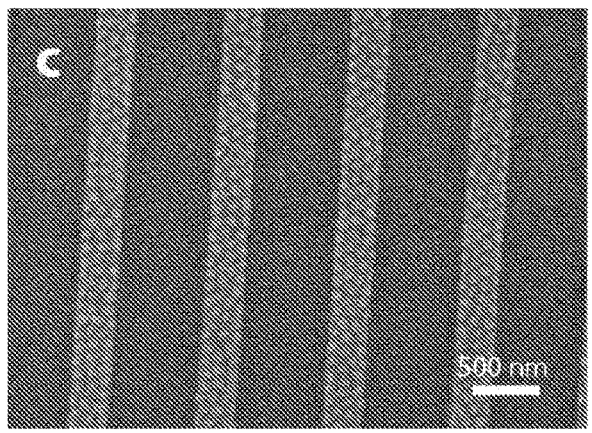
Figure 6D:
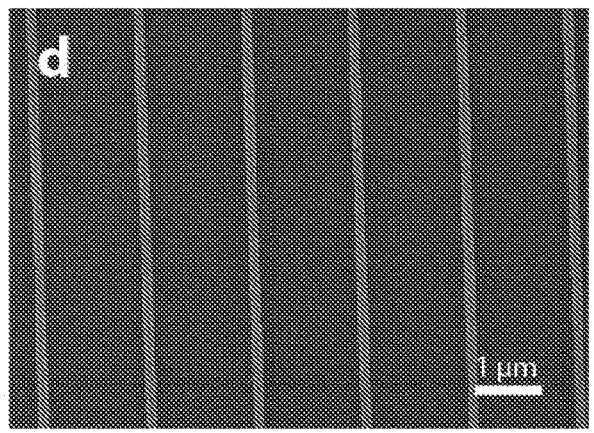

Interestingly, in a window of film thicknesses near 0.5R, and surface preference near ΛN=11 the symmetric di-block copolymer forms a complex, neck-like hexagonal morphology (FIG. 2a, middle row; see cross-section in FIG. 2b). This unconventional morphology for film thickness significantly less than ½L₀ can be rationalized by the combination of extreme frustration of the lying morphology and a relatively strongly preferential substrate. In this morphology, the bottom half of the film is enriched in PMMA that preferentially wets the substrate, whereas the top half of the film is depleted in PMMA, forming a hexagonal pattern. The morphology consists of neck-like PMMA domains, similar to the cone morphology that has been previously proposed by Han. It is noted here that the formation of islands and holes, which is common for film thicknesses that are incommensurate with the wetting conditions, is less favorable in the case of ultrathin films, because hole formation requires exposing the high surface energy substrate (i.e., de-wetting).

Figure 1E:
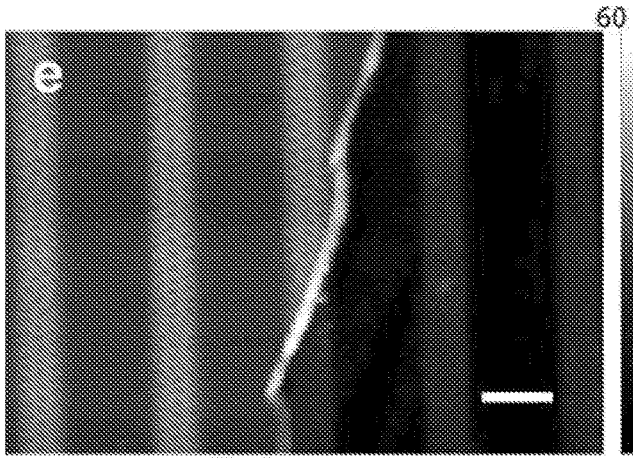
Figure 1F:
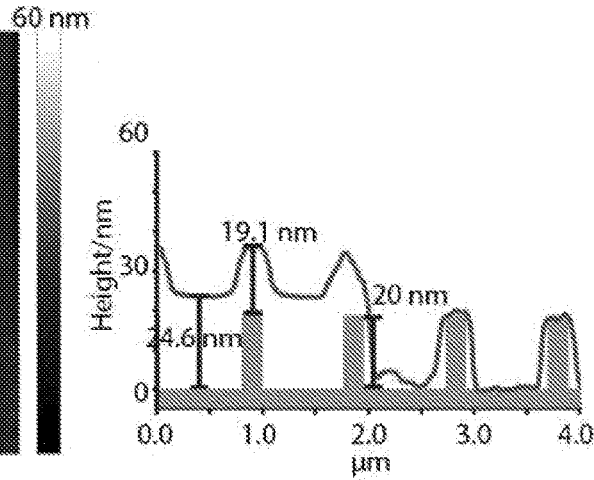
Figure 1G:
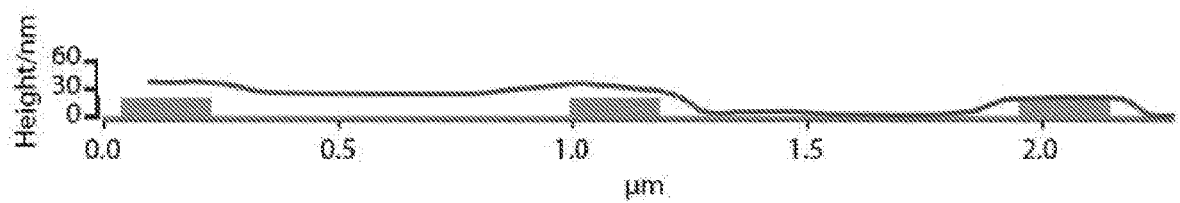
Figure 9:
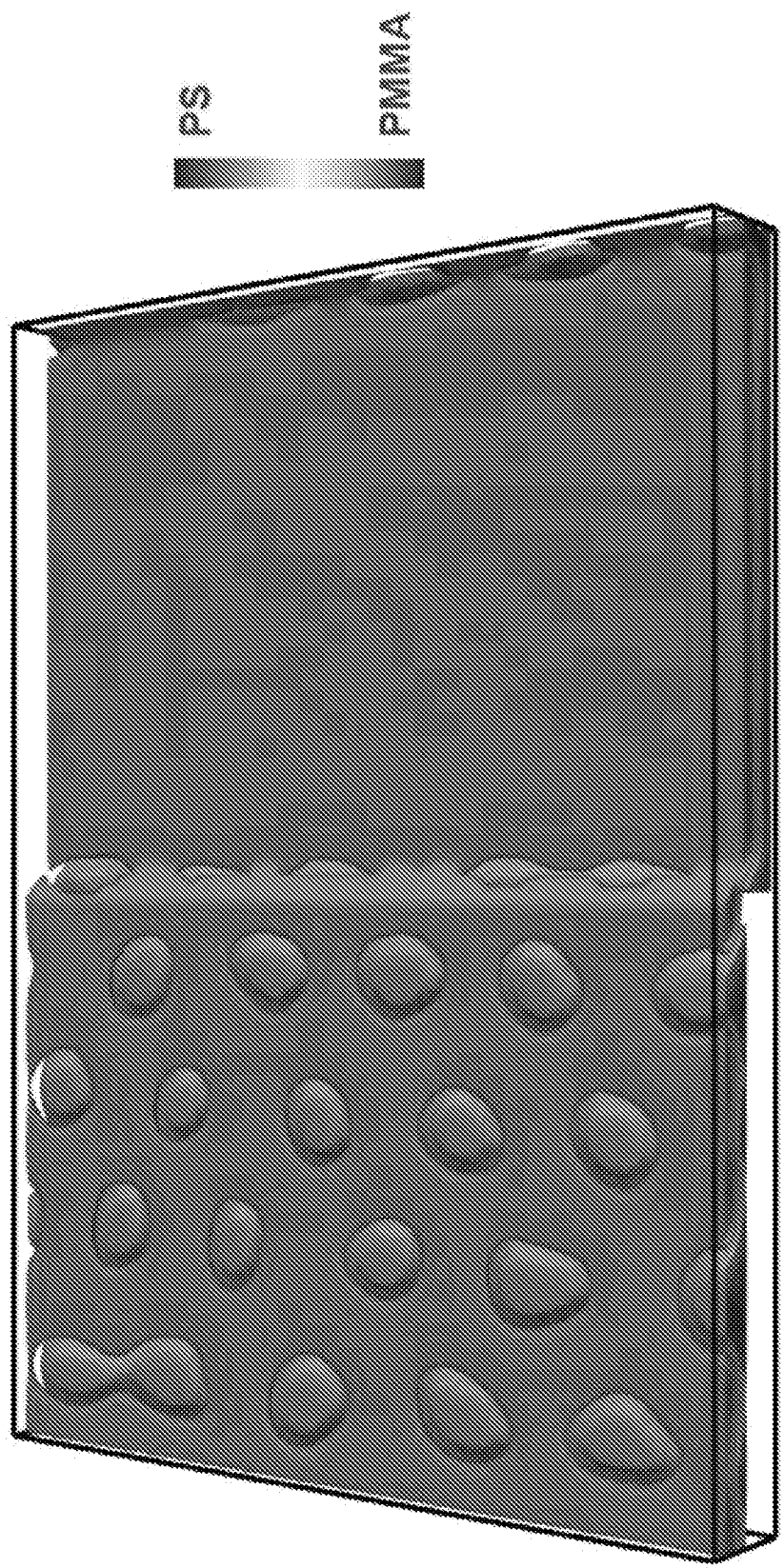
FIG. 9 shows simulation results showing the dual morphology on substrates that consist of adjacent plateau and trench with the same parameters used in FIG. 4a,b after extended run ($T=3.1\times10^7$ Monte-Carlo steps).

The combination of thickness confinement and high substrate selectivity lead to extreme sensitivity of the morphology to the local film thickness. Hence, the formation of different morphologies on the plateaus and in the trenches suggests that the thicknesses of the BCP film above each region are different. Partially exposing the substrate by scratching the film with a syringe needle enabled film profiling by SFM and determining the local film thicknesses above the plateaus and above the trenches for each sample (FIGS. 1e-1g). Local film thickness values were averaged for at least 4 patterns on each sample, which differ in the lateral dimensions of the trenches and plateaus but feature the same trench depth and nominal (cast) film thickness. For each sample, the nominal film thickness, denoted as $h_{nominal}$, was measured in topographically smooth areas on the same substrate. FIG. 3a shows that in all samples, the average film thickness above the plateaus ($<h_{pl}>$) was lower than the nominal film thickness (denoted by a dashed line). Conversely, almost all average film thicknesses above the trenches ($<h_{tr}>$) were higher than the nominal film thickness (FIG. 3b). Simulations of the structure of a film that covers both a plateau and a trench and takes into account the difference in film thicknesses indeed reproduce the dual morphology observed experimentally (FIG. 4). Additional simulations ran over 5-10 times longer show no appreciable change in morphology (FIG. 9), indicating that this morphology represents a thermodynamic equilibrium.

FIG. 1e-1g show that the film continues smoothly from the plateaus into the trenches. The corrugation of the top film surface does not vanish even with prolonged annealing times. This roughness is explained by the balance of capillary forces acting on the thin polymer film. The Laplace pressure thins the film on the plateaus and increases the film thickness in the trenches. The Laplace pressure is counterbalanced by the disjoining pressure, Π:

$$\gamma \frac{\partial^2 h}{\partial x^2} = -\prod(h) \quad (1)$$

where γ denotes the surface tension of the copolymer film and x denotes the lateral coordinate. The fact that the film surface is not flat indicates that the extent of the disjoining pressure is significant. This arises from the non-uniformity of the structure in the direction normal to the substrate, and thus demonstrates that the experimental morphology cannot be simply standing cylinders. Assuming that the surface curvature changes approximately linearly with the trench depth for a given trench width and nominal film thickness, so is the thickness difference between the trenches and plateaus, as it was found experimentally (FIG. 3c).

The above discussion reveals that applying ultrathin block copolymer films on a selective substrate that is topographically defined may enable obtaining dual morphologies over different areas in a controlled fashion. The topography of the substrate could be looked upon as providing a differentiating mechanism, which causes the film in certain areas of the substrate (i.e., the trenches) to differ in thickness from other areas of the substrate (i.e., the plateaus). Then, the extreme sensitivity of morphology to film thickness leads to different patterns in each area. As one of these morphologies could be lying lamellae, an important consequence is the ability to create patterned domains that are spaced by featureless domains that are defined by the topographic design, as shown in FIG. 1.

The versatility of our approach for obtaining complex morphologies and patterns is further demonstrated in FIG. 5. First, obtaining patterned regions spaced by non-patterned domains could be extended to plateaus featuring non-regular shapes (FIG. 5a, 5b). Second, complex morphologies could be obtained by harnessing the ability to switch the orientation of domains with respect to the substrate from parallel to perpendicular by incorporating a small amount of nanoparticles. FIG. 5c-5f shows samples with alternating dots-stripes patterns obtained by adding gold nanoparticles that were modified with thiol-terminated polyethyleneoxide ligands ($M_n$ 5 kDa) to the BCP solution before casting. In the annealed films, these nanoparticles segregate to the PMMA domains; the competition between the preference of the PMMA domains to wet the polar substrate and the tendency of the nanoparticles to segregate to the film surface to lower its surface tension causes the lamellae to orient normal to the substrate in order to expose the PMMA domains. In narrow trenches, the standing lamellae are oriented across the trenches, whereas in wider trenches they are oriented more randomly and tend to align parallel to the trench walls in some locations. This could be attributed to commensurability condition between the nanocomposite lamellar period and the trench width. Apparently, the narrow trenches cannot accommodate complete multiples of the nanocomposite lamellae oriented along the walls, which causes its domains to orient across the trench, whereas wider trenches can tolerate slight mismatches in commensurability.

Interestingly, it is noted that the PMMA stripes oriented across the narrow trenches also connect dots on different plateaus (FIG. 5c-5e); this may be used to induce registry between different patterned regions. Combining these conditions with a more complicated design of the topographical substrate may lead to more elaborate patterns.

In summary, it was demonstrated that block copolymer films cast on topographically defined substrates feature different thicknesses in the plateau and trench regions. In the regime of ultra-confined films, the morphology (and hence the surface pattern) becomes very sensitive to slight variations in film thickness and substrate selectivity. Combining these two effects enables the creation of coatings showing coexisting patterns on different regions, including the ability to have patterned regions spaced arbitrarily with non-patterned regions. Such complex patterns could be further elaborated by controlling domain alignment and orientation, e.g., by including nanoparticles. The strength of this approach lies in its simplicity and generality. Complex patterns are easily obtained with a neat block copolymer in a single step process. From our experience, complex patterns are also obtained with other types of block copolymers, such as polystyrene-block-poly(vinyl pyridine) and polystyrene-block-poly(lactic acid) (research in progress). It is envisioned that adding different types of fillers to different types of block copolymers could give rise to functional coatings that derive their properties from the controlled spatial arrangement of functional components. These research directions are currently underway and will be reported in due course.

EXPERIMENTAL DETAILS

PS-b-PMMA di-block copolymer ($M_n$ 312 kDa, PDI 1.27, 45 wt % PS, $L_0$=84 nm) was synthesized by standard anionic polymerization under nitrogen atmosphere. The molecular weight, size distribution and polystyrene weight percentage were determined by gel permeation chromatography (GPC) in tetrahydrofuran against PS standards for the PS block and comparison of the $^1$H NMR signals for the phenyl and methoxy groups for the PMMA block. $L_0$ was determined by SAXS.

Gold nanoparticles were synthesized according to known procedures from chloroauric acid ($HAuCl_4 \cdot 3H_2O$) and sodium citrate. Average size (13 nm) and size dispersity of the nanoparticles was determined by transmission electron microscopy (FEI Tecnai T12 G$^2$ Spirit TEM) and analyzed using ImageJ software. In order to effect ligand exchange, the as-synthesized nanoparticles were stirred overnight at room temperature with thiol terminated PEO ligands ($M_n$ 5,000 Da, Sigma-Aldrich). The nanoparticles were then transferred to chloroform using a small amount of ethanol as a co-solvent and vigorous shaking, followed by washing with deionized water. The chloroform solution was concentrated by evaporation. Excess PEO-SH ligands were removed by centrifugation at 6000 rpm for 10 minutes with n-hexane as the non-solvent. This procedure was repeated three times.

Topographically patterned substrates with varying feature sizes were prepared using electron beam lithography (Raith e-LiNE) on silicon wafer substrates using 250 nm-thick PMMA resist (495 kDa, Microchem) followed by cold development (2 min, −5° C.) in MIBK:IPA (1:3) developer solution and reactive ion etching with $C_4F_8$ and $SF_6$ (Oxford Instruments Plasmalab System 100). For substrates used in nanocomposite experiments, initial patterning was done by thermal nanoimprint lithography using a 140 nm thick PMMA resist (35 kDa, Acros) spin coated from anisole (Sigma-Aldrich) with an in-house imprint press. Following etching, substrates were cleaned with oxygen plasma and piranha solution. Trench depths were measured using scanning force microscopy.

Block copolymer thin films were prepared on flat and patterned substrates by spin coating toluene solutions of the BCP of various concentrations (0.4% to 1.0% w/w) for 30 seconds at 3000 rpm. All films were annealed for 15 minutes in a closed petri dish with saturated chloroform vapor environment at ambient temperature. Nanocomposite films were prepared using solutions containing 250 μL BCP in toluene (0.8 wt %) and 250 μL Au-PEO nanoparticles in chloroform (0.021 μM, determined by UV-Vis spectrometry at λ=531 nm using $\varepsilon_{531}$=2.77×10$^8$ M$^{-1}$ cm$^{-1}$). These solutions were spin coated and annealed under the same conditions as described above. Some BCP films were prepared on silicon wafers featuring 100-nm thick thermal oxide, solvent annealed, and floated on a 10 vol % HF solution by slow insertion of the sample at a shallow angle, and then transferred onto HF-treated silicon wafers by touching the surface of the solution with the receiving substrate. This allowed inspecting the bottom side of these films by microscopy.

Film characterization was performed using high resolution scanning electron microscopy (FEI Sirion HR-SEM and FEI Magellan 400L XHR SEM) and scanning force microscopy (SFM, Dimension 3100 with Nanoscope V controller, Veeco). Film thicknesses above the trenches and plateaus were determined by scratching away part of the film with a 19 gauge syringe needle, followed by SFM scanning and analysis of the seam between the intact BCP film and the exposed silicon substrate using the step analysis tool (Nanoscope Analysis Program v. 1.40, Bruker), which averages height values of different scan lines of selected areas. These thicknesses were determined by referencing to the SFM height values of the corresponding, completely exposed features. Local film thickness values were averaged for at least 4 patterns on each sample; error bars in FIG. 3a show the corresponding standard deviation values.

Simulation Details

Figure 8A:
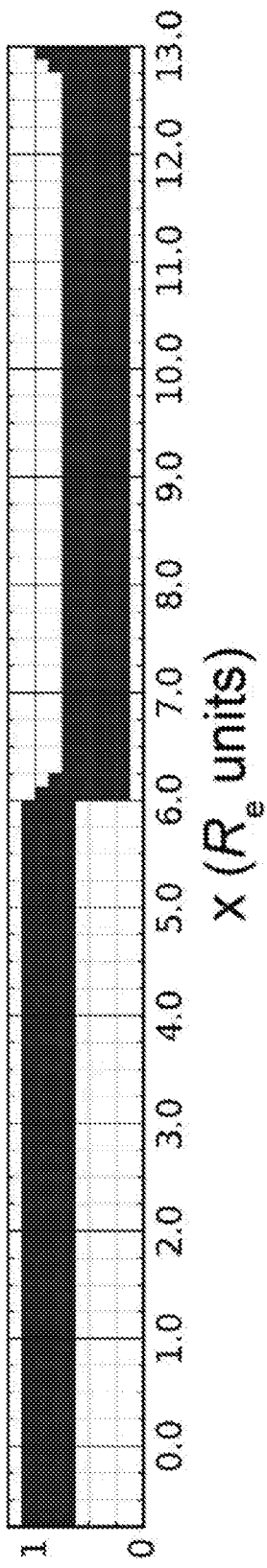
FIGS. 8a-8b show illustration of the simulation cell: 8(a) The volume filled by the copolymer film; (8b) location where the surface field acts (blue and white grid points denote $\Lambda N=11$ and $\Lambda N=20$ for the bottom and sidewalls of the trench, respectively). Lengths are measured in units of $R_e$. The grid, shown in this figure, is coarser than the grid used to evaluate the non-bonded interactions by a factor of 2.
Figure 8B:
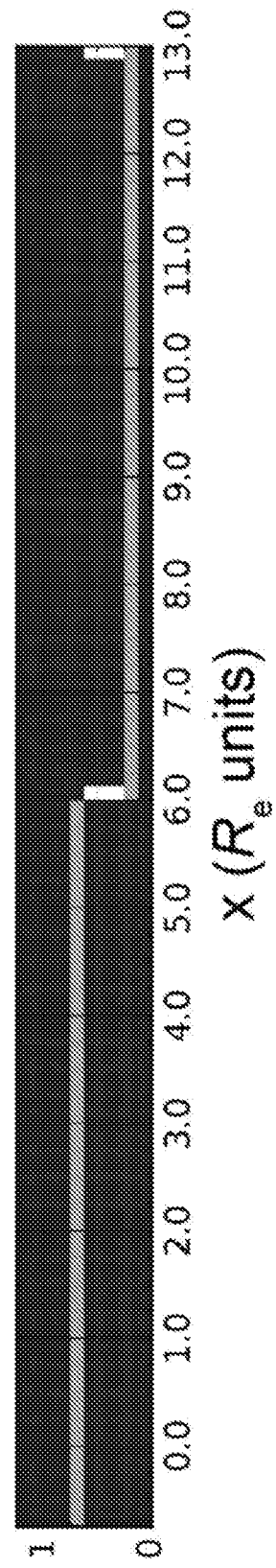

A soft, coarse-grained model was used to represent the copolymer melt. The polymers consist of two structurally symmetric blocks A and B, each of which is comprised of N/2=32 segments. The film is confined into a volume V that is surrounded by impenetrable walls. The geometry of the confinement is adapted to the experiments (FIG. 8). The top surface of the film, in contact with the chloroform vapor, is non-preferential, whereas the substrate prefers the PMMA-component via a short-range interaction of strength ΛN (see non-bonded interactions below). Segments along the linear, flexible molecular backbone are connected via harmonic bonds. In the simulations, the unit of length is set by the end-to-end distance, $R_e$, of the polymers in the absence of confinement or non-bonded interactions. The non-bonded interactions, $\mathcal{H}_{nb}$, are comprised of three parts: (i) the average repulsion between segments limits the isothermal compressibility. The corresponding coarse-grained parameter is the inverse isothermal compressibility and, in accord with previous studies, the value κN=50 was used. (ii) The repulsion between AB pairs is larger than that between segments of the same type such that the bare Flory-Huggins parameter is $\chi N=30$:

$$\frac{\mathcal{H}_{nb}}{\sqrt{\mathcal{N}}k_BT} = \int \frac{dr}{R_e^3}\left\{\frac{\kappa N}{2}[\phi_A+\phi_B-1]^2 - \frac{\chi^N}{4}[\phi_A-\phi_B]^2\right\}$$

where $\phi_A$ and $\phi_B$ denote the normalized densities (i.e., volume fractions) of A (PS) and B (PMMA) segments, respectively. These non-bonded interactions are evaluated via a collocation grid of linear dimension $\Delta L=R_e/8$. (iii) Additionally, there are surface fields that repel the A (PS) component and attract the B (PMMA) component with the same strength, $\Lambda$. These surface interactions extend a distance $\Delta L$ away from the substrate. The free surface of the film is non-preferential, accounting for the similarity of the surface tensions of PS and PMMA under chloroform vapor. The average segment density, $\rho_0$, is set by the invariant degree of polarization $$\sqrt{\mathcal{N}} \equiv \rho_0 R_e^3/N = 128.$$

The morphologies are obtained after a quench of the system from the disordered state to $\chi N=30$. Within self-consistent field theory, the equilibrium lamellar spacing is $L_0 \approx 1.83\, R_e$. The simulations employ the Single-Chain-in-Mean-Field algorithm in conjunction with Smart-Monte-Carlo moves that give rise to Rouse-like dynamics. The simulations runs were extended to at least $T=1.2\times10^6$ Monte-Carlo steps, corresponding to $T=35\, R^2/D$, with $D=2.925\times10^{-5}\, R^2/MCS$ being the self-diffusion coefficient. Extended simulations (5-10 times longer) ran on flat and topographically patterned substrates show no appreciable change in morphology, indicating that the observed morphologies represent thermodynamic equilibria.

The Disjoining Pressure and the Shape of the Free Surface

The simulation model cannot describe the free surface in contact with the vapor phase; therefore, the geometry from the experimental measurements was extracted. In the experiment the free surface of the film is not flat but the shape is dictated by a balance of capillary forces: the Laplace pressure tends to even out the curvature of the film surface, whereas the disjoining pressure, $\Pi(h)$, which quantifies the forces of interaction between the free polymer-vapor surface and the substrate, tends to maintain preferred film thicknesses over different parts of the substrate (i.e., plateaus and trenches). The disjoining pressure is comprised of a negligible, short-range contribution that decays exponentially with the film thickness h, and two long-range contributions, $\Pi_{lr}(h)$:

$$\prod_{lr}(h) = \frac{\sqrt{\mathcal{N}}k_BT}{R_e^3}\tilde{\prod}\left(\frac{h}{R_e}\right) - \frac{A_H}{6\pi h^3}$$

where $(\tilde{\Pi}h/R_e)$ is a scaling function and $A_H$ is the Hamaker constant. The first term the morphological contribution—stems from the preference of the copolymer morphology for a particular film thickness if it exhibits a nontrivial structure perpendicular to the substrate (such as the neck-like shapes of the PMMA domains found in our study). For example, this morphological contribution gives rise to the formation of island-and-hole structures in thick lamellar films (as illustrated below). Its strength is set by the free-energy density of the film, and its spatial variation only depends on the dimensionless film height $h/R_e$. The second, long-range contribution—Hamaker contribution—arises from van-der-Waals interactions. The specific form of the equation above refers to a simple planar substrate. Generalizations to layered substrates or corners are available.

To illustrate the morphological contribution, the known behavior of block copolymer film coarsening that leads to island-and-hole structures was considered. For a lying lamellar structure with p internal AB interfaces parallel to the substrate, the scaling function takes the form:

$$\tilde{\prod}(x) = \frac{3\pi^2}{8p^2}x^2 - \frac{3}{4}\left(\frac{\pi^2}{3}\chi^N\right)^{1/3}$$

in the strong segregation limit. The first term arises from the thickness-dependent stretching of the chain conformations, whereas the second term arises from the chemical potential. There is no explicit contribution from the interfaces because the interface free energy is independent of the film thickness h at fixed p. This provides a simple analytic description of the morphology inside the trenches. Unfortunately, no such explicit form is available for the complex neck-like hexagonal morphology on the plateaus, but it is expected that its magnitude is similar. In the case of an island-hole morphology the film surface is locally planar. Thus, the Laplace pressure vanishes, and the force balance requires $\Pi(h)=0$. The relative strength of the morphological and Hamaker contributions to the long-range part of the disjoining pressure is dictated by the dimensionless quantity, $\sqrt{\mathcal{N}}\,k_BT/A_H$. Neglecting the Hamaker contribution, the condition $\Pi(h^*/R_e)=0$ identifies the well-known preferred film thickness, $h^*$, of the island-hole structures (with a non-preferential free film surface).

An order-of-magnitude estimate of the relative strength of the morphological and Hamaker contributions to the disjoining pressure can be obtained from the following consideration. Using $\sqrt{\mathcal{N}}=128$ and $R_e \approx L_0/1.83 \approx 46$ nm, is obtained for the order of magnitude of the morphological contribution $\Pi_{morph} \approx 5\times10^3$ J/m. The Hamaker constant between an organic polymer and silicon oxide is on the order of $A_H \approx 2\times10^{-20}$ J and thus $\Pi_{VdW} \approx 10^2$ J/m$^3$ is obtained for a film of h=20 nm. Thus, even for these ultrathin films, the morphological contribution dominates over the Hamaker contribution. Additionally, it is noted that the Laplace pressure is on the order $\Pi \approx 2.4\times10^3$ J/m$^3$ (using $\gamma=40$ mN/m as the surface tension of the polymer and $6\times10^{-5}$ nm$^{-1}$ as the curvature of the films on top of the plateaus, which was estimated using SFM profiles). Hence, the Laplace pressure is chiefly compensated by the morphological contribution to the disjoining pressure.

In case of the plateau-trench structure the experiments demonstrate: (i) that the polymer film is continuous and (ii) that the free film surface is slightly corrugated. The first observation indicates that no pinned, three-phase contact line exists between the polymer, substrate and vapor at the borders of the plateaus. The latter observation suggests that there is a non-vanishing Laplace pressure that is balanced by disjoining pressure (cf. Equation (1) in the main text).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A film comprising at least one block co-polymer (BCP) having at least two block units; wherein said at least one BCP has different morphologies within said film; and wherein the thickness of said film is at most equal to the radius of gyration ($R_g$) of said at least one BCP.

2. A film according to claim 1, wherein said film has at least two morphological sections of said at least one BCP; and wherein the thickness of said film is at most equal to the radius of gyration ($R_g$) of said at least one BCP.

3. A film according to claim 1, wherein said film has at least two morphological sections of said at least one BCP; and wherein the thickness of said film is at most equal to $\frac{1}{2}L_0$ of said at least one BCP.

4. A film according to claim 1, wherein said at least one BCP has different morphologies within said film; and wherein the thickness of said film is at most equal to $\frac{1}{2}L_0$ of said at least one BCP.

5. A film according to claim 1, wherein said thickness is smaller than $R_g$ of said at least one BCP.

6. A film according to claim 1, wherein said thickness is smaller than $\frac{1}{2}L_0$ of said at least one BCP.

7. The film according to claim 1, further comprising at least one filler.

8. A device comprising at least one film according to claim 1.

9. A process for the preparation of a film as defined in claim 1; said process comprising the steps of:
   a. providing a topographically patterned substrate;
   b. providing a solution comprising at least one block co-polymer (BCP);
   c. coating said solution on top of said topographically patterned substrate to form a coated film;
   d. annealing said coated film thereby forming said film as defined in claim 1.

10. The process according to claim 9, wherein said coating is spin coating conducted at a rate of between 1000-8000 rpm.

11. The process according to claim 9, wherein said coating is dip coating.

12. The process according to claim 9, wherein said BCP has a concentration of at least 0.01 wt % in said solution.

13. The process according to claim 9, wherein said annealing is selected from solvent vapor annealing and thermal annealing.

14. The process according to claim 9, further comprises adding at least one filler to said solution in step (b).

* * * * *